US006819184B2

(12) United States Patent
Pengelly et al.

(10) Patent No.: US 6,819,184 B2
(45) Date of Patent: Nov. 16, 2004

(54) RF TRANSISTOR AMPLIFIER LINEARITY USING SUPPRESSED THIRD ORDER TRANSCONDUCTANCE

(75) Inventors: Raymond Sydney Pengelly, Hillsborough, NC (US); Simon Maurice Wood, Los Gatos, CA (US); John Phillip Quinn, Mountain View, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 10/289,734

(22) Filed: Nov. 6, 2002

(65) Prior Publication Data

US 2004/0085132 A1 May 6, 2004

(51) Int. Cl.$^7$ ................................. H03F 3/68

(52) U.S. Cl. ........................ 330/295; 330/286

(58) Field of Search ................ 330/53, 124 R, 330/286, 295

(56) References Cited

U.S. PATENT DOCUMENTS

| | | | | |
|---|---|---|---|---|
| 6,317,002 | B1 | * 11/2001 | Griffiths | ..................... 330/295 |
| 6,448,859 | B2 | * 9/2002 | Morizuka | ................... 330/295 |
| 6,614,308 | B2 | * 9/2003 | Moller et al. | ............... 330/295 |

OTHER PUBLICATIONS

Iwamoto et al., "An Extended Doherty Amplifier with High Efficiency Over a Wide Power Range," 2001 IEEE MTT–S Digest, pp. 931–934.
Yang et al., "Experimental Investigation on Efficiency amnd Linearity of Microwave Doherty Amplifier," 2001 IEEE MTT–S Digest, pp. 1367–1370.
Danny R. Webster, "Low–Distortion MMIC Power Amplifier Using a New Form of Derivative Superposition," IEEE Transactions on Microwave Theory and vol. 49, No. 2, Feb. 2001, pp. 328–332.
Van der Heijden et al., "Ultra–Linear Distributed Class–AB LDMOS RF Power Amplifier for Base Stations," 2001 IEEE MTT–S Digest, pp. 1363–1366.
Cao et al., "A 3.2V, 45% Efficient, Novel Class AB+C CDMA MMIC Power Amplifier Using Quasi Enhancement Mode Phemts," 2000 IEEE Radio Frequency Integrated Circuits Symposium, pp. 93–96.
Bahl et al., "Class–B Power MMIC Amplifiers with 70 Percent Power–Added Efficiency," IEEE Transactions on Microwave Theory and Techniques, vol. 37, No. 9, Sep. 1989, pp. 1315–1320.
Maeda et al., "Source Second–Harmonic Control for High Efficiency Power Amplifiers," IEEE Transactions on Microwave Theory and Techniques, vol. 43, No. 12, Dec. 1995, pp. 2952–2958.
Kim et al., "A New Linearization Technique for MOSFET RF Amplifier Using Multiple Gated Transistors," IEEE Microwave and Guided Wave Letters, vol. 10, No. 9, Sep. 2000, pp. 317–373.
Kim et al., "An FET–Level Linearization Method Using a Predistortion Branch FET," IEEE Microwave and Guided Wave Letters, vol. 9, No. 6, Jun. 1999, pp. 233–235.

(List continued on next page.)

*Primary Examiner*—Khanh Van Nguyen
(74) *Attorney, Agent, or Firm*—Beyer Weaver & Thomas LLP

(57) ABSTRACT

The linearity of a transistor amplifier comprising a plurality of transistors operating parallel is improved by reducing the odd order transconductance derivatives of signals generated by the transistors. The transistors can be provided in groups with each group having a different bias voltage applied thereto or each group of transistors can have a different input signal applied thereto. The groups of transistors can have different physical parameters such as the width to length ratio of gates in field effect transistors and threshold voltages for the transistors.

19 Claims, 3 Drawing Sheets

OTHER PUBLICATIONS

Hanington et al., "High–Efficiency Power Amplifier Using Dynamic Power–Supply Voltage for CDMA Applications," IEEE Transactions on Microwave Theory and Techniques, vol. 47, No. 8, Aug. 1999, pp. 1471–1776.

Sevic, "Introduction to Doherty Power Amplifiers," IEEE MTT Workshop WSB, Efficiency and Linearity and Enhancement Methods for Portable RF/MW Wireless PA's, Jun. 11, 2000.

* cited by examiner

RF TRANSISTOR AMPLIFIER LINEARITY USING SUPPRESSED THIRD ORDER TRANSCONDUCTANCE

BACKGROUND OF THE INVENTION

This invention relates generally to RF and microwave transistor amplifiers, and more particularly the invention relates to improving linearity of such power amplifiers. RF power amplifiers typically comprise a plurality of transistor cells operating in parallel. The transistors comprise silicon laterally defused MOSFETS (LDMOSFET) or other semiconductor technologies including silicon bipolar, SIC MESFET, and III–V devices such as GAAS MESFET, InGaP HBT, and GaN HEMT.

Improved linearity and operation is a goal in RF power transistor technologies. There are many common factors in the determination of linearity in various RF power transistor technologies including changing input and impedance with signal level, changing capacitances and their derivatives with signal levels, breakdown and substrate conduction effects, class of operation, and changing transconductance and its derivatives with bias and signal levels.

The present invention is directed to improving linearity by reducing odd order transconductance derivatives.

BRIEF SUMMARY OF THE INVENTION

In accordance with the invention the linearity of RF power transistors is improved by reducing odd order transconductance derivatives by employing multiple transistors and derivative superposition with cancellation of positive and negative values of transconductance derivatives of the multiple transistors.

In one embodiment of the invention, the multiple transistors, each of which can include a plurality of transistor cells, are driven by a common RF input, but with different DC bias voltages. In another embodiment, the transistors and transistor cells have different conduction threshold voltages. This is accomplished by varying the channel doping of an FET, for example, during fabrication. In another embodiment of the invention, the phase of the RF input is varied among the transistors, with or without varying the DC bias voltages to the transistors or the threshold voltages. In yet another embodiment, the channel and gate width to length ratios of the transistors are varied, preferably with the different gate width transistors being on the same semiconductor die, thereby decreasing sensitivity to process variations and component tolerances.

The advantages of suppressing third order and other odd order transconductance is increased linearity or increased efficiency at a set linearity, which leads to improved manufacturing margins and smaller overall power amplifier sizes. The invention and objects and features of the invention will be more readily apparent from the following detailed description and appended claims when taken with the drawing.

DETAILED DESCRIPTION OF THE INVENTION

Transconductance is a measure of change in output current as a function of input voltage. In a field effect transistor such as a LDMOS FET, incremental drain current, $i_d$, can be expressed as a function of incremental gate voltage, $v_g$, around quiescent bias point $I_d(V_g, 0)$ where $I_d$ is the large-signal drain-current, as follows.

$$i_d = \frac{dI_d}{dV_g}\bigg|_{V=V_{g0}} v_g + \frac{1}{2}\frac{d^2 I_d}{dV_g^2}\bigg|_{V=V_{g,0}} v_g^2 + \frac{1}{6}\frac{d^3 I_d}{dV_g^3}\bigg|_{V=V_{g0}} v_g^3 =$$
$$g_1 v_g + g_2 v_g^2 + g_3 v_g^3$$

The second derivative or second harmonic of the transconductance derivatives is out of bound of the input signal frequency and thus does not present a problem. However, the third derivative and higher odd derivatives are closer in frequency to the input signal and can cause linearity problems.

Figure 1:
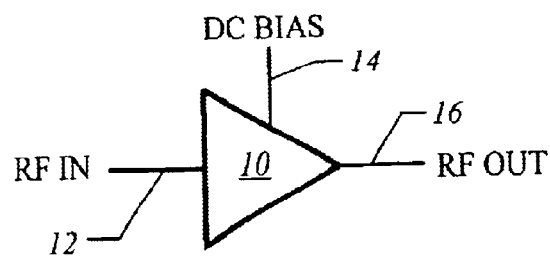
FIG. 1 is a symbolic representation of a conventional RF power transistor amplifier which may comprise a plurality of transistors driven by a common RF input with a common DC bias.

In accordance with the invention the adverse effects of odd order transconductance derivatives are reduced by cancellation of positive and negative values in multiple transistor cells. This is accomplished in several ways, as illustrated in FIGS. 2–5, rather than operating all transistor cells with a common RF input and a common DC bias voltage, and with common cell structures, as illustrated schematically in FIG. 1 in which all transistor cells illustrated at 10 are driven by one RF input signal 12 with a common DC bias voltage 14.

Figure 2:
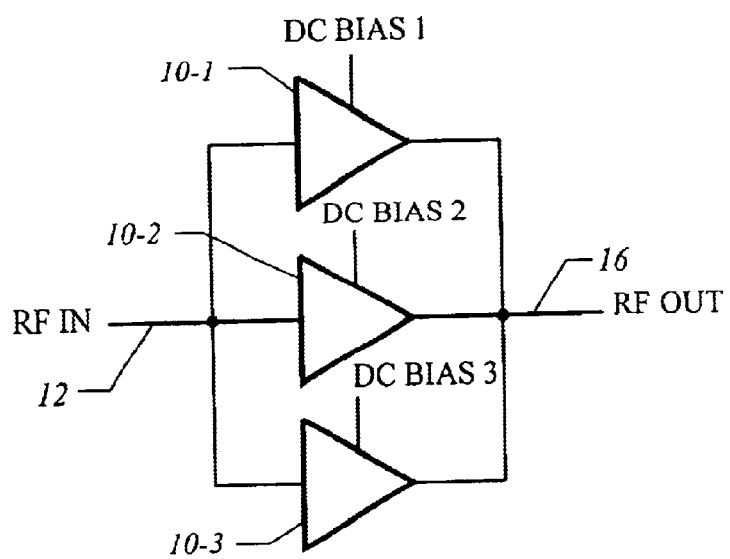
FIG. 2 is a schematic of an RF transistor amplifier comprising three transistors, each driven by a common RF input, but with different DC bias voltages in accordance with an embodiment of the invention.

In accordance with one embodiment of the invention as illustrated in FIG. 2, the transistors are organized into three groups 10-1, 10-2, and 10-3 with the inputs and the outputs of the three groups connected together with a common RF input drive 12 and a common output 16. However, each group has a separate DC bias as noted. For example, using LDMOS transistor cells, the biases can be for example 4.1, 4.2 and 4.3 volts for an input voltage in the range of 4 to 5 volts. As is common practice, the DC bias voltage can be applied along with the RF input drive applied to the control element (e.g. gate or base) of the transistors.

Figure 3:
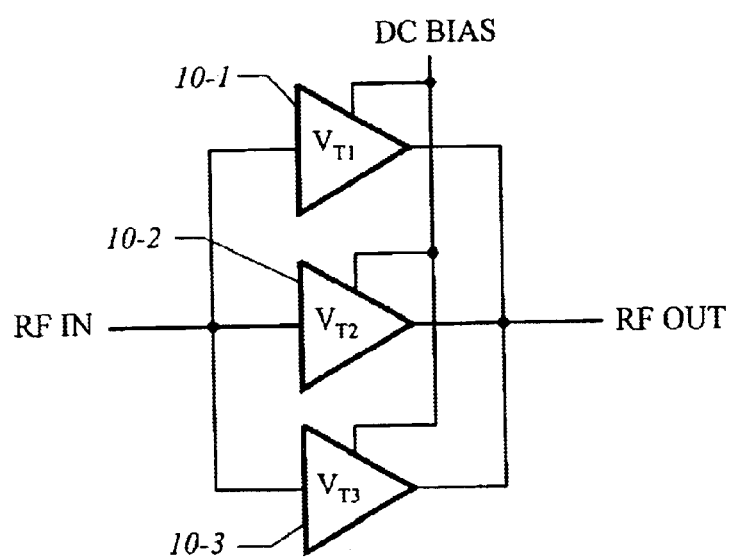
FIG. 3 and FIG. 4 are schematics of other embodiments of the invention in which three power transistors are driven by a common RF input with a common DC bias, but with different threshold levels and with varied input phase, respectively.

FIG. 3 is a schematic of another embodiment of the invention in which three transistor group 10-1, 10-2, and 10-3 have the same DC bias voltage and RF input drive, but the threshold voltages for the transistor groups differ by varying the channel doping of the transistor cells. For example, by changing the channel doping, the threshold voltage can be changed. Again, the DC bias voltage can be combined with the RF input drive applied to the control element (e.g., gate or base) of the transistors.

Figure 4:
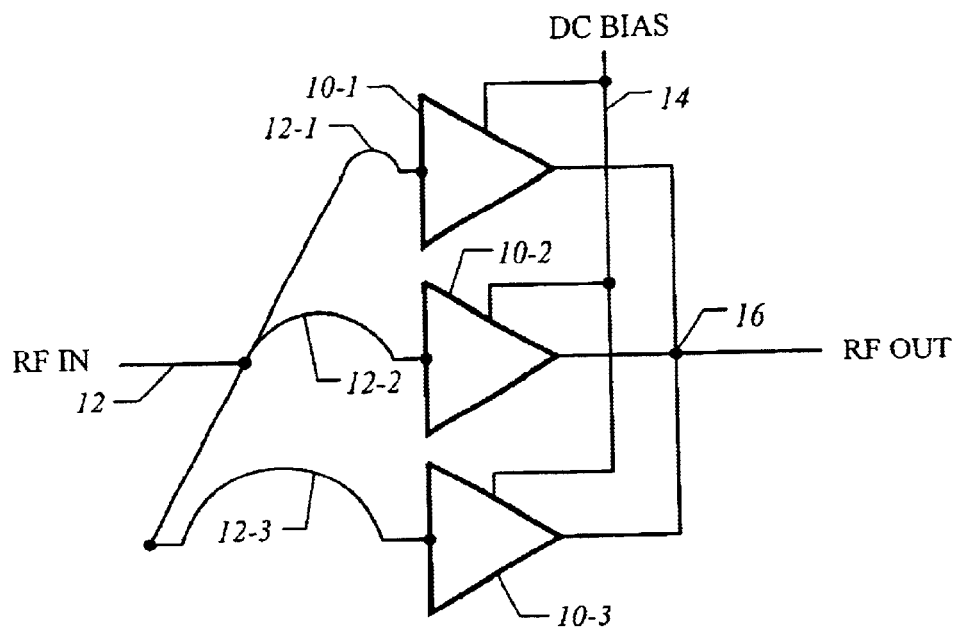

FIG. 4 is another embodiment of the invention in which the transistor groups 10-1, 10-2, and 10-3 have the same DC bias 14 and with the same RF input 12, but the input is varied in phase by varying the lengths of input lines 12-1, 12-2, and 12-3. The differences in input phases causes a staggering of the positive and negative values of transconductance derivatives for the multiple transistors, and when summed at 16, the positive and negative values tend to cancel.

Figure 5:
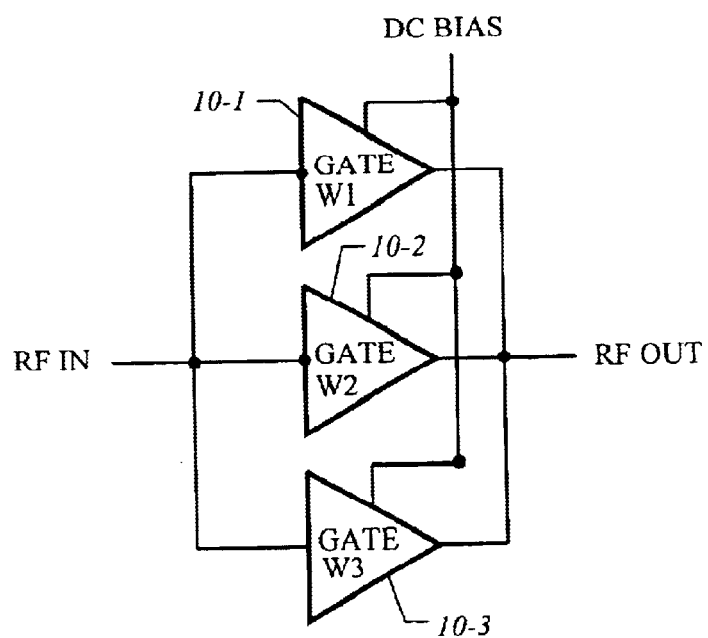
FIG. 5 is a schematic of another embodiment of the invention in which a plurality of FET transistors have different gate width to length ratios.

FIG. 5 is a schematic of another embodiment of the invention in which the transistor groups 10-1, 10-2, and 10-3 have different gate width to length ratios. By changing the width to length ratios by 10–20%, the positive and negative values of the transconductance derivatives are again varied for the multiple transistor groups.

Figure 6:
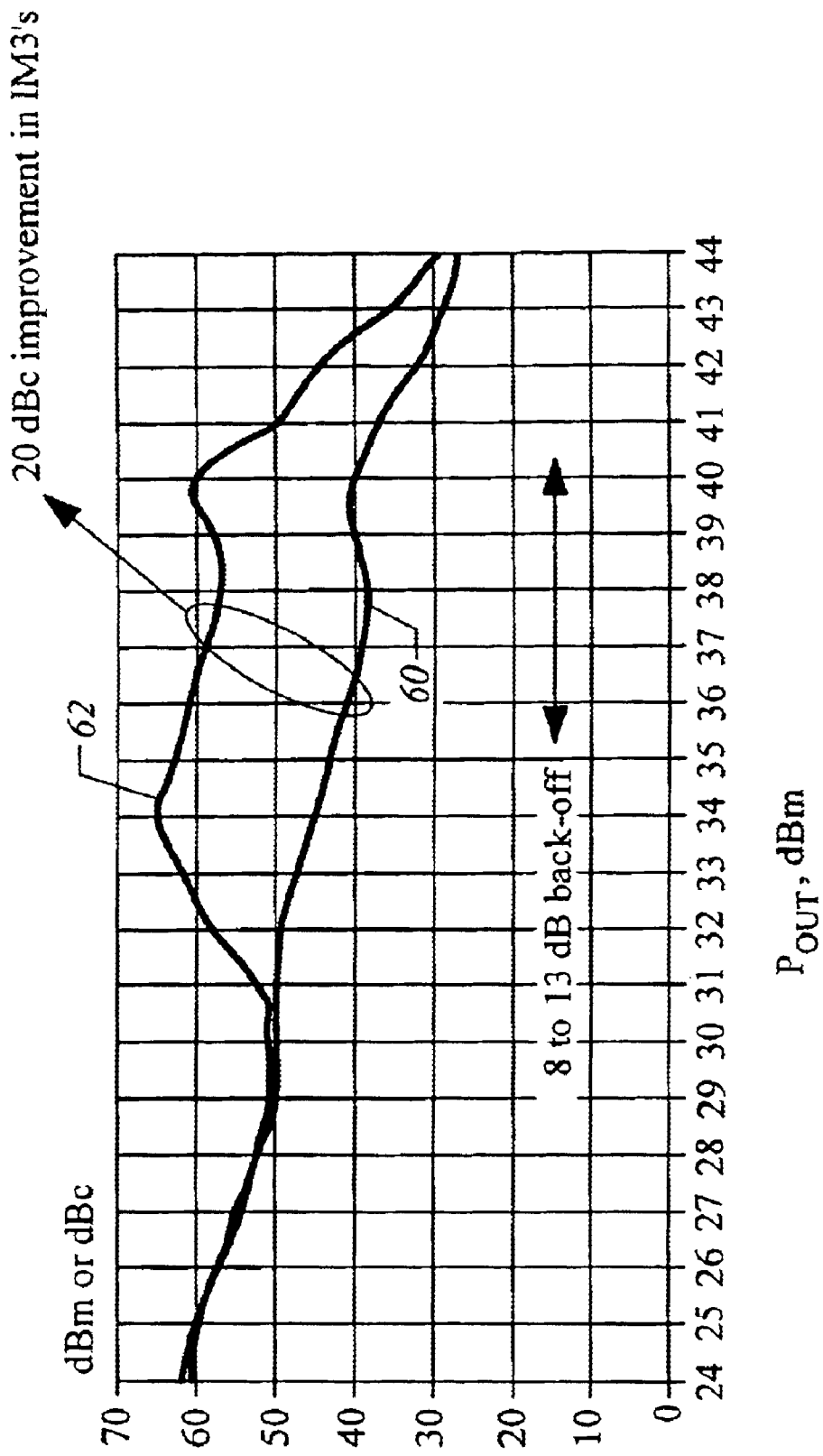
FIG. 6 is a graph of third order intermodulation power for four LDMOS FETs with conventional bias and drive and with multigate bias, respectively.

FIG. 6 is a graph illustrating third order derivative power (dBm or dBc) versus powerout (dBm) for four LDMOS FET transistors as conventionally driven and biased as shown at 60 and as driven with different bias voltages, similar to the schematic of FIG. 2 for three transistors, as shown at 62. The transistors were driven at 2.14 GHz with a total output power of 70 Watts. It will be noted in the 8 to 13 dB backoff power range, the power of the third order derivatives is reduced from approximately 40 dBm to 60 dBm, and consequently increasing the linearity of the power amplifier.

There have been described several embodiments of multiple transistor amplifiers which are constructed, biased, or driven so that positive and negative values of odd order transconductance derivatives tend to cancel, thus improving on the linearity of the power amplifier operation. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. An RF power amplifier having improved linearity and operation comprising a plurality of transistors operating in parallel with different drive voltage and bias voltage applied to the transistors whereby positive and negative values of odd number transconductance derivatives from the plurality of transistors tend to cancel.

2. The RF power amplifier as defined by claim 1 wherein the transistors have different bias voltages.

3. The RF power amplifier as defined by claim 1 wherein the transistors have different input signals.

4. The RF power amplifier as defined by claim 3 wherein phases of the input signals to the transistors differ.

5. The RF power amplifier as defined by claim 4 wherein the transistors have different bias voltages.

6. The RF power amplifier as defined by claim 4 wherein the transistors have different input voltages.

7. The RF power amplifier as defined by claim 6 wherein the transistors have different bias voltages.

8. The RF power amplifier as defined by claim 1 wherein the transistors are selected from the group consisting of field effect transistors and bipolar transistors.

9. The RF power amplifier as defined by claim 8 wherein the field effect transistors and bipolar transistors include silicon and compound semiconductor material.

10. An RF power amplifier having improved linearity and operation comprising a plurality of transistors operating in parallel with physical parameters of the transistors differing whereby positive and negative values of odd number transconductance derivatives from the plurality of transistors tend to cancel.

11. The RF power amplifiers defined by claim 10 wherein the transistors comprise field effect transistors having gates, the width to length ratios of the gates of the transistors differing.

12. The RF power amplifier as defined by claim 10 wherein the transistors comprise field effect transistors, the voltage threshold of the transistors differing.

13. A method of improving the operating linearity of a multiple transistor power amplifier comprising the steps of:
   a) providing a plurality of groups of transistors connected with a common output, and
   b) operating the plurality of groups of transistors whereby positive and negative values of odd order transconductance derivatives of input signals tend to cancel.

14. The method as defined by claim 13 wherein step b) includes altering the input signals as applied to the plurality of groups.

15. The method as defined by claim 14 wherein step b) includes providing input signals having different phases as applied to the plurality of groups.

16. The method as defined by claim 13 wherein step b) includes applying different bias voltages to the plurality of groups.

17. The method as defined by claim 13 wherein step a) includes providing a plurality of groups of transistors having different physical parameters.

18. The method as defined by claim 17 wherein the transistors are field effect transistors having gates, each group of transistors having a gate width to length ratio which differs from other groups.

19. The method as defined by claim 18 wherein the transistors are field effect transistors, each group of transistors having threshold values that differ from other groups.

* * * * *